US010714328B2

(12) United States Patent
Harada et al.

(10) Patent No.: US 10,714,328 B2
(45) Date of Patent: Jul. 14, 2020

(54) SEMICONDUCTOR MANUFACTURING APPARATUS AND METHOD OF MANUFACTURING SEMICONDUCTOR DEVICE

(71) Applicant: TOSHIBA MEMORY CORPORATION, Minato-ku (JP)

(72) Inventors: Tomonori Harada, Yokkaichi (JP); Tatsuhiko Koide, Kuwana (JP); Katsuhiro Sato, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 27 days.

(21) Appl. No.: 15/904,595

(22) Filed: Feb. 26, 2018

(65) Prior Publication Data
US 2019/0074171 A1 Mar. 7, 2019

(30) Foreign Application Priority Data

Sep. 7, 2017 (JP) ................................. 2017-172272

(51) Int. Cl.
*H01L 21/02* (2006.01)
*H01L 21/687* (2006.01)
*H01L 21/67* (2006.01)

(52) U.S. Cl.
CPC .. *H01L 21/02021* (2013.01); *H01L 21/02019* (2013.01); *H01L 21/6708* (2013.01); *H01L 21/68764* (2013.01)

(58) Field of Classification Search
CPC .......... H01L 21/6708; H01L 21/02021; H01L 21/02087
See application file for complete search history.

(56) References Cited

U.S. PATENT DOCUMENTS 6,827,814 B2   12/2004   Taniyama et al.
9,793,176 B2   10/2017   Kobayashi et al.
(Continued)

FOREIGN PATENT DOCUMENTS

JP   2001-319849   11/2001
JP   2004-079909    3/2004
(Continued)

OTHER PUBLICATIONS

Machine translation of JP2004-079909, 2004, 43 pages. (Year: 2004).*

*Primary Examiner* — Keath T Chen
*Assistant Examiner* — Margaret D Klunk
(74) *Attorney, Agent, or Firm* — Oblon, McClelland, Maier & Neustadt, L.L.P.

(57) ABSTRACT

In one embodiment, a semiconductor manufacturing apparatus includes a supporter configured to support a wafer. The apparatus further includes a first member including a first portion that faces a first region on an upper face of the wafer and a second portion that intervenes between the wafer and the first portion. The apparatus further includes a second member including a third portion that faces a second region on the upper face of the wafer and a fourth portion that intervenes between the wafer and the third portion. The apparatus further includes a first liquid feeder configured to feed a first liquid for processing the wafer to the first region, a first gas feeder configured to feed a first gas between the wafer and the first portion, and a second gas feeder configured to feed a second gas between the wafer and the second portion.

6 Claims, 3 Drawing Sheets

(56) References Cited

U.S. PATENT DOCUMENTS

| | | | |
|---|---|---|---|
| 9,852,933 B2* | 12/2017 | Ito | H01L 21/67109 |
| 2001/0037858 A1* | 11/2001 | Taniyama | H01L 21/6708 |
| | | | 156/345.21 |
| 2004/0084144 A1* | 5/2004 | Yokouchi | C03C 15/00 |
| | | | 156/345.11 |
| 2005/0276921 A1* | 12/2005 | Miya | B08B 3/02 |
| | | | 427/240 |
| 2006/0021636 A1* | 2/2006 | Miya | B08B 3/04 |
| | | | 134/33 |
| 2006/0042722 A1* | 3/2006 | Kim | H01L 21/67034 |
| | | | 141/100 |
| 2007/0227444 A1* | 10/2007 | Nishide | G03F 7/16 |
| | | | 118/52 |
| 2008/0035610 A1* | 2/2008 | Miya | H01L 21/02087 |
| | | | 216/84 |
| 2008/0254224 A1* | 10/2008 | Kishimoto | H01L 21/6708 |
| | | | 427/427.1 |
| 2011/0030737 A1* | 2/2011 | Amano | H01L 21/67051 |
| | | | 134/32 |
| 2011/0240067 A1* | 10/2011 | Kishimoto | H01L 21/02087 |
| | | | 134/33 |
| 2013/0171831 A1* | 7/2013 | Namba | H01L 21/32134 |
| | | | 438/748 |
| 2014/0051258 A1* | 2/2014 | Izumoto | H01L 21/30604 |
| | | | 438/748 |
| 2015/0093905 A1 | 4/2015 | Fujiwara et al. | |
| 2015/0234296 A1 | 8/2015 | Yagi | |
| 2016/0372340 A1* | 12/2016 | Takeaki | H01L 21/6708 |
| 2016/0372341 A1 | 12/2016 | Kobayashi et al. | |
| 2018/0012754 A1* | 1/2018 | Nanba | H01L 21/30604 |

FOREIGN PATENT DOCUMENTS

| | | |
|---|---|---|
| JP | 2012-186188 | 9/2012 |
| JP | 2015-070015 | 4/2015 |
| JP | 2015-153947 | 8/2015 |
| JP | 2016-072324 | 5/2016 |
| JP | 2016-139743 | 8/2016 |
| JP | 2017-011033 | 1/2017 |
| WO | WO 2011/004769 A1 | 1/2011 |

* cited by examiner

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2017-172272, filed on Sep. 7, 2017, the entire contents of which are incorporated herein by reference.

FIELD

Embodiments described herein relate to a semiconductor manufacturing apparatus and a method of manufacturing a semiconductor device.

BACKGROUND

When a wafer is to be processed, it is necessary in some cases to suppress processing of a bevel (edge portion) of the wafer. For example, when an amorphous silicon layer on a silicon wafer is etched with a liquid chemical, it is necessary is some cases to suppress etching of a bevel of the silicon wafer that is exposed from the amorphous silicon layer.

DETAILED DESCRIPTION

Embodiments will now be explained with reference to the accompanying drawings.

In one embodiment, a semiconductor manufacturing apparatus includes a supporter configured to support a wafer. The apparatus further includes a first member including a first portion that faces a first region on an upper face of the wafer and a second portion that intervenes between the wafer and the first portion. The apparatus further includes a second member including a third portion that faces a second region on the upper face of the wafer and a fourth portion that intervenes between the wafer and the third portion. The apparatus further includes a first liquid feeder configured to feed a first liquid for processing the wafer to the first region, a first gas feeder configured to feed a first gas between the wafer and the first portion, and a second gas feeder configured to feed a second gas between the wafer and the second portion.

First Embodiment

Figure 1A:
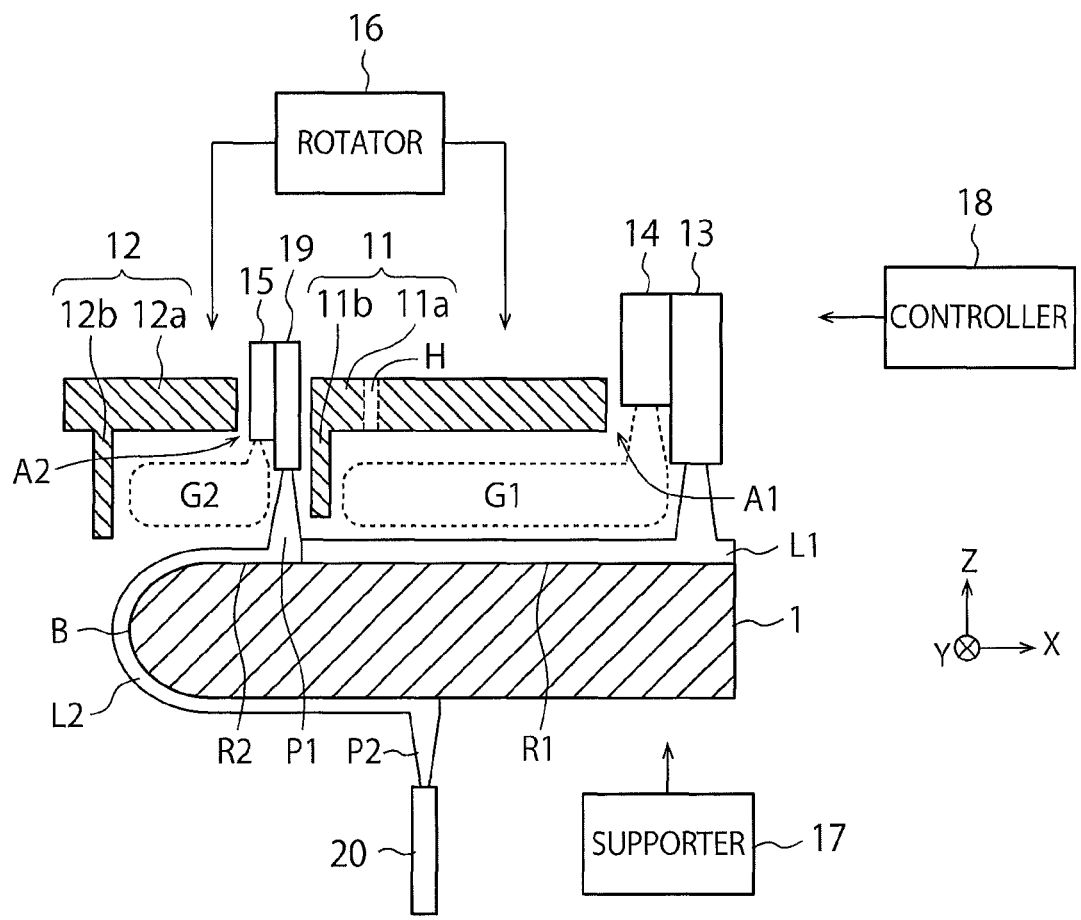
FIGS. 1A and 1B are a cross-sectional view and a top view showing a configuration of a semiconductor manufacturing apparatus of a first embodiment.
Figure 1B:
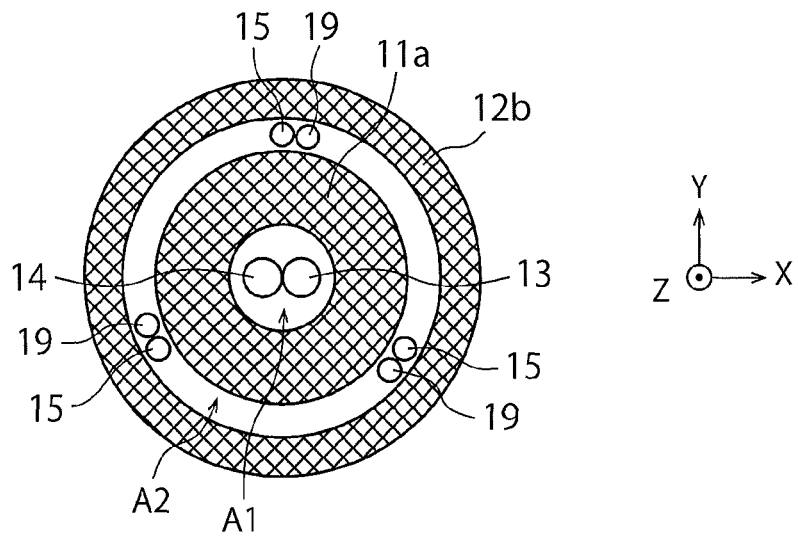

FIGS. 1A and 1B are a cross-sectional view and a top view showing a configuration of a semiconductor manufacturing apparatus of a first embodiment. FIG. 1A corresponds to the cross-sectional view, and FIG. 1B corresponds to the top view.

This semiconductor manufacturing apparatus includes a first blocking member 11 which is an example of a first member, a second blocking member 12 which is an example of a second member, a liquid chemical nozzle 13 which is an example of a first liquid feeder, a first gas nozzle 14 which is an example of a first gas feeder, and a second gas nozzle 15 which is an example of a second gas feeder. This semiconductor manufacturing apparatus further includes a rotator 16, a supporter 17, a controller 18, an upper face nozzle 19 which is an example of an upper face feeder of a second liquid feeder, and a lower face nozzle 20 which is an example of a lower face feeder of the second liquid feeder.

This semiconductor manufacturing apparatus is a wet etching apparatus which etches a workpiece film (not shown) on a wafer 1. An example of the wafer 1 is a silicon wafer. An example of the workpiece film is an amorphous silicon layer. FIGS. 1A and 1B show an X-direction and a Y-direction which are parallel to an upper face and a lower face of the wafer 1 and perpendicular to each other, and a Z-direction perpendicular to the upper face and the lower face of the wafer 1. In the specification, the +Z-direction is regarded as the upward direction, and the −Z-direction is regarded as the downward direction. The −Z-direction may coincide with the direction of gravity or may not coincide with the direction of gravity.

FIG. 1A shows a first region R1 and a second region R2 on the upper face of the wafer 1 and a bevel B of the wafer 1. The first region R1 is positioned on a side of a center portion of the wafer 1. The second region R2 is positioned on a side of a periphery portion of the wafer 1. The bevel B of the present embodiment is exposed from the aforementioned workpiece film. Hence, it is desirable to suppress etching of the bevel B when etching the workpiece film.

The first blocking member 11 is disposed and used above the wafer 1. The first blocking member 11 has a facing portion 11a facing the first region R1 on the upper face of the wafer 1, and an intervening portion 11b intervening between the wafer 1 and the facing portion 11a. The facing portion 11a is an example of a first portion. The intervening portion 11b is an example of a second portion.

The facing portion 11a has an opening portion A1 and has an annular shape as shown in FIG. 1B. The facing portion 11a further has a through hole H for allowing gas to escape from a space between the wafer 1 and the facing portion 11a. The intervening portion 11b is provided on a lower face of the facing portion 11a and has a cylindrical shape. Therefore, the space between the wafer 1 and the facing portion 11a is surrounded by the wafer 1, the facing portion 11a and the intervening portion 11b.

The second blocking member 12 is also disposed and used above the wafer 1. The second blocking member 12 has a facing portion 12a facing the second region R2 on the upper face of the wafer 1, and an intervening portion 12b intervening between the wafer 1 and the facing portion 12a. The facing portion 12a is an example of a third portion. The intervening portion 12b is an example of a fourth portion.

The facing portion 12a has an opening portion A2 and has an annular shape as shown in FIG. 1B. The facing portion 11a of the first blocking member 11 is contained in this opening portion A2. The intervening portion 12b is provided on a lower face of the facing portion 12a and has a cylindrical shape. Therefore, a space between the wafer 1 and the facing portion 12a is surrounded by the wafer 1, the facing portion 12a, the intervening portion 12b and the intervening portion 11b.

The liquid chemical nozzle 13 is inserted into the opening portion A1, and feeds a liquid chemical for etching the workpiece film on the wafer 1 to the first region R1 (see sign L1). The liquid chemical is, for example, an aqueous choline solution containing choline as an etchant. The liquid chemical is an example of a first liquid. The liquid chemical nozzle 13 of the present embodiment perpendicularly ejects the liquid chemical onto the upper face of the wafer 1.

The intervening portion 11b is disposed in order to cause the liquid chemical to hardly flow out from the first region R1 to the second region R2. Thereby, etching of the bevel B with the liquid chemical can be suppressed. A distance between the wafer 1 and the intervening portion 11b is set to be, for example, approximately 3.0 to 12.0 mm.

The first gas nozzle 14 is inserted into the opening portion A1, and feeds a first gas into the space between the wafer 1 and the facing portion 11a (see sign G1). The first gas is used in order to remove gas that decreases an etching rate of the workpiece film from this space and to fill this space with the first gas. The first gas of the present embodiment is gas that leads to an action to increase the etching rate of the workpiece film with the aforementioned liquid chemical, and is, for example, gas containing choline vapor. It is considered that the etching rate increases because by placing the aqueous choline solution in an atmosphere of choline vapor, choline hardly vaporizes from the aqueous choline solution.

The facing portion 11a and the intervening portion 11b are disposed in order to fill the space above the first region R1 with the first gas. Thereby, etching of a workpiece film with a liquid chemical can be promoted, and a liquid chemical component can be suppressed from being vaporized until the liquid chemical reaches the vicinity of the intervening portion 11b.

The second gas nozzle 15 is inserted into the opening portion A2 between the facing portion 11a and the facing portion 12a, and feeds a second gas into the space between the wafer and the facing portion 12a (see sign G2). The second gas is used in order to fill this space with the second gas. The second gas of the present embodiment is gas that leads to an action to decrease the etching rate of the workpiece film with the aforementioned liquid chemical, and is, for example, gas containing oxygen. It is considered that the etching rate decreases because oxygen dissolves in the aqueous choline solution when the aqueous choline solution flows from the first region R1 to the second region R2.

The facing portion 12a, the intervening portion 12b and the intervening portion 11b are disposed in order to fill the space above the second region R2 with the second gas. Thereby, etching of a workpiece film with a liquid chemical can be suppressed. Moreover, with the intervening portion 11b and the like, the state of the liquid and the gas on and above the first region R1 can be separated from the state of the liquid and the gas on and above the second region R2.

The semiconductor manufacturing apparatus of the present embodiment further feeds etching suppressing liquid which suppresses etching of the wafer 1 from the upper face nozzle 19 and the lower face nozzle 20 to the bevel B (see sign L2). Signs P1 and P2 shown in FIG. 1A denote etching suppressing liquid fed to the second region R2 on the upper face of the wafer 1 from the upper face nozzle 19, and etching suppressing liquid fed onto the lower face of the wafer 1 from the lower face nozzle 20. The upper face nozzle 19 is inserted into the opening portion A2 between the facing portion 11a and the facing portion 12a. The upper face nozzle 19 perpendicularly ejects the etching suppressing liquid onto the upper face of the wafer 1. The lower face nozzle 20 perpendicularly ejects the etching suppressing liquid onto the lower face of the wafer 1. Details of the upper face nozzle 19 and the lower face nozzle 20 are described later with reference to FIG. 2. The etching suppressing liquid is, for example, aqueous hydrogen peroxide and is an example of a second liquid.

The rotator 16 rotates the first blocking member 11 and the second blocking member 12 around the center axis of the wafer 1. The rotator 16 may rotate the first blocking member 11 and the second blocking member 12 at the same rotational speed, or may rotate them at different rotational speeds. The rotator 16 of the present embodiment is configured to independently rotate the first and second blocking members 11 and 12, and hence, can rotate the first and second blocking members 11 and 12 at different rotational speeds.

The supporter 17 supports the wafer 1 in the semiconductor manufacturing apparatus, and can also rotate the wafer 1 around the center axis of the wafer 1. By rotating the wafer 1, the liquid chemical can be caused to spread on the wafer 1. In this stage, by also rotating the first and second blocking members 11 and 12, the state of the liquid and the gas on and above the wafer 1 can be adjusted to be a desired state.

The controller 18 controls various kinds of operation of the semiconductor manufacturing apparatus. For example, the controller 18 controls movement of the first blocking member 11, movement of the second blocking member 12, ejection of liquid and gas from the liquid chemical nozzle 13, the first gas nozzle 14, the second gas nozzle 15, the upper face nozzle 19 and the lower face nozzle 20, rotational operation of the rotator 16, rotational operation of the supporter 17, and the like. The controller 18 is made up, for example, of a processor, an electric circuit, a computer or the like.

Figure 2:
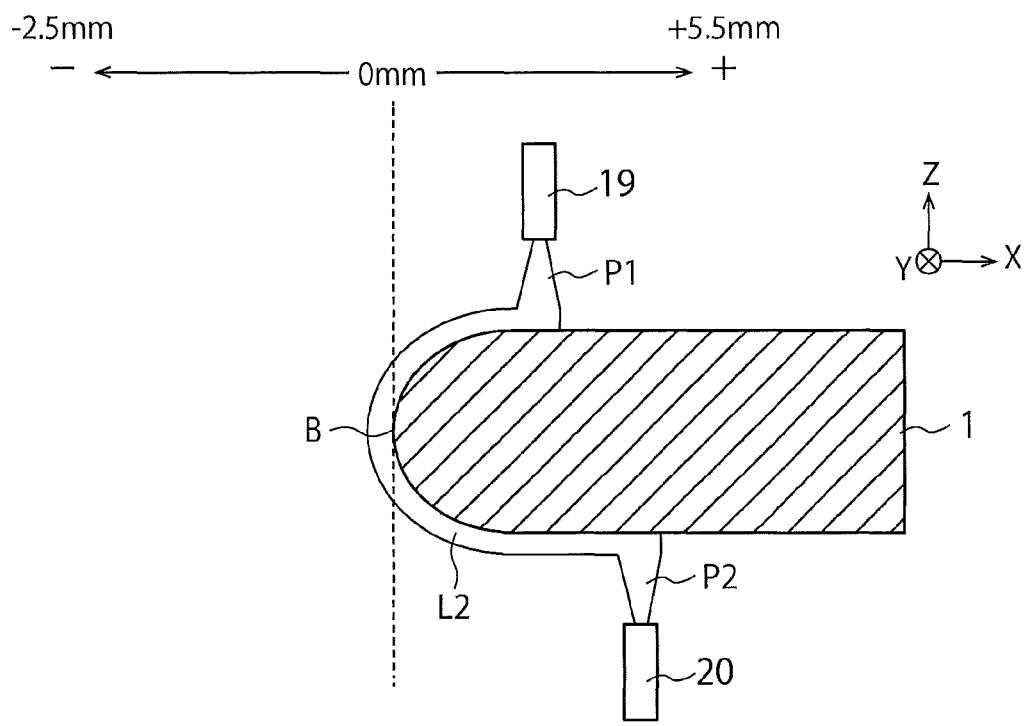
FIG. 2 is a cross-sectional view for explaining operation of the semiconductor manufacturing apparatus of the first embodiment.

FIG. 2 is a cross-sectional view for explaining operation of the semiconductor manufacturing apparatus of the first embodiment.

As mentioned above, the semiconductor manufacturing apparatus of the present embodiment includes the upper face nozzle 19 which feeds the etching suppressing liquid to the second region R2 on the upper face of the wafer 1, and the lower face nozzle 20 which feeds the etching suppressing liquid onto the lower face of the wafer 1. Thereby, the bevel B of the wafer 1 is protected by the etching suppressing liquid.

The dotted line shown in FIG. 2 indicates the outermost portion of the bevel B of the wafer 1. Herein, a first place at which the etching suppressing liquid from the upper face nozzle 19 reaches the upper face of the wafer 1, and a second place at which the etching suppressing liquid from the lower face nozzle 20 reaches the lower face of the wafer 1 are described.

In the present embodiment, a distance between the outermost portion of the bevel B and the second place in the XY-plane is fixed to a fixed value (for example, 3.0 mm). Meanwhile, a distance between the outermost portion of the bevel B and the first place in the XY-plane is changed within a certain range. For example, as indicated by arrows in FIG. 2, the upper face nozzle 19 of the present embodiment can change the position of the first place relative to the outermost portion of the bevel B within a range of +5.5 mm to −2.5 mm in units of 0.1 mm, and ejects the etching suppressing liquid within this range. Thereby, a region in which the etching suppressing liquid is fed can be adjusted, which enables the etching suppressing liquid to more effectively protect the bevel B from the liquid chemical.

As above, the semiconductor manufacturing apparatus of the present embodiment feeds the liquid chemical for etching, the first gas, the second gas and the etching suppressing liquid to the wafer 1 in the state where the first and second blocking members 11 and 12 are disposed above the wafer 1. Therefore, according to the present embodiment, etching of the bevel B of the wafer 1 can be suppressed.

The apparatus configuration and wafer processing in the present embodiment may be applied to semiconductor manufacturing apparatuses other than the wet etching apparatus as long as they are semiconductor manufacturing apparatuses which process the wafer 1 with liquid. The same holds true for second and third embodiments mentioned later.

Second Embodiment

Figure 3:
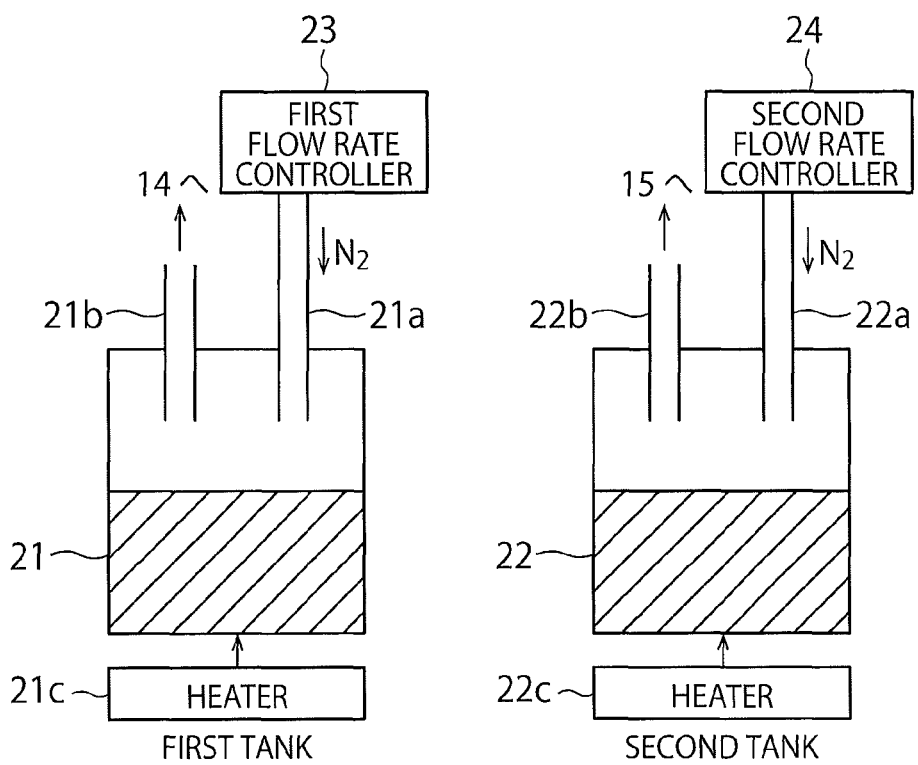
FIG. 3 is a schematic diagram for explaining operation of the semiconductor manufacturing apparatus of a second embodiment.

FIG. 3 is a schematic diagram for explaining operation of a semiconductor manufacturing apparatus of the second embodiment.

The semiconductor manufacturing apparatus of the present embodiment includes a first tank 21, a second tank 22, a first flow rate controller 23 and a second flow rate controller 24 in addition to the constituents shown in FIGS. 1A to 2. Operation of these components are also controlled by the controller 18. The first tank 21 and the first flow rate controller 23 are examples of a first adjuster. The second tank 22 and the second flow rate controller 24 are examples of a second adjuster.

The first tank 21 feeds the first gas to the first gas nozzle 14. The first gas of the present embodiment is a mixed gas containing nitrogen and choline vapor. The second tank 22 feeds the second gas to the second gas nozzle 15. The second gas of the present embodiment is also a mixed gas containing nitrogen and choline vapor. As above, the first gas and the second gas contain the same etchant (that is, choline) as the etchant in the liquid chemical fed from the liquid chemical nozzle 13.

Both the first tank 21 and the second tank 22 contain aqueous choline solutions. The first tank 21 includes an inlet pipe 21a through which nitrogen gas is fed from the first flow rate controller 23, an outlet pipe 21b through which mixed gas is fed to the first gas nozzle 14, and a heater 21c which heats the aqueous choline solution in the first tank 21. The second tank 22 includes an inlet pipe 22a through which nitrogen gas is fed from the second flow rate controller 24, an outlet pipe 22b through which mixed gas is fed to the second gas nozzle 15, and a heater 22c which heats the aqueous choline solution in the second tank 22.

When the heater 21c heats the aqueous choline solution, choline vapor is generated from the aqueous choline solution, and mixed with nitrogen gas from the first flow rate controller 23. As a result, as the first gas, the mixed gas is fed from the first tank 21 to the first gas nozzle 14. The concentration of choline in the first gas can be adjusted by controlling the temperature of the heater 21c and the flow rate of nitrogen gas from the first flow rate controller 23.

The same holds true for the heater 22c. The concentration of choline in the second gas can be adjusted by controlling the temperature of the heater 22c and the flow rate of nitrogen gas from the second flow rate controller 24.

The first tank 21, the second tank 22, the first flow rate controller 23 and the second flow rate controller 24 of the present embodiment adjust the concentration of choline in the first gas to be higher than the concentration of choline in the second gas by control from the controller 18. Namely, the first gas is to contain choline in a higher concentration, and the second gas is to contain choline in a lower concentration. In the present embodiment, such concentration adjustment is realized by adjusting the temperature of the aqueous choline solution in the first tank 21 to be higher than the temperature of the aqueous choline solution in the second tank 22.

When the concentration of choline in the first gas is high, choline is hardly vaporized from the liquid chemical on the first region R1. Therefore, the etching rate of the workpiece film on the first region R1 is high. Meanwhile, when the concentration of choline in the second gas is lower than that in the first gas, choline is easily vaporized from the liquid chemical on the second region R2. Therefore, the etching rate of the workpiece film on the second region R2 is lower than that on the first region R1. This is effective when etching of the workpiece film on the second region R2 is wanted to be more suppressed than etching of the workpiece film on the first region R1.

Meanwhile, the first tank 21, the second tank 22, the first flow rate controller 23 and the second flow rate controller 24 of the present embodiment may adjust the concentration of choline in the first gas to be lower than the concentration of choline in the second gas by control from the controller 18. In this case, the first gas is to contain choline in a lower concentration, and the second gas is to contain choline in a higher concentration. In the present embodiment, such concentration adjustment is realized, for example, by adjusting the temperature of the aqueous choline solution in the first tank 21 to be lower than the temperature of the aqueous choline solution in the second tank 22.

Such concentration adjustment is effective when the etching rate is wanted to be controlled uniformly in the plane of the wafer 1. In general, the concentration of choline in the liquid chemical on the wafer 1 decreases more as going apart from the center portion of the wafer 1, due to vaporization of choline from the liquid chemical. In this case, the etching rate decreases more as going apart from the center portion of the wafer 1. When the concentration of choline in the first gas is, therefore, adjusted to be lower than the concentration of choline in the second gas, such decrease in etching rate can be suppressed, and uniformity of the etching rate can be enhanced.

As above, the semiconductor manufacturing apparatus of the present embodiment feeds the liquid chemical for etching, the first gas, the second gas and the etching suppressing liquid to the wafer 1 in the state where the first and second blocking members 11 and 12 are disposed above the wafer 1. Moreover, in the present embodiment, the components of the first gas and the second gas are adjusted by the first tank 21, the second tank 22, the first flow rate controller 23 and the second flow rate controller 24. Therefore, according to the present embodiment, promotion or suppression of etching can be performed with high precision.

Third Embodiment

A semiconductor manufacturing apparatus of a third embodiment is explained with reference to FIGS. 1A, 1B and 2 by focusing on differences between the first and third embodiments.

In FIGS. 1A and 1B, when the liquid chemical nozzle 13 feeds an alkali liquid chemical such as an aqueous choline solution, pH of the alkali liquid chemical on the second region R2 so as to reduce the etching rate. Accordingly, when the workpiece film is to be etched, it is desired to suppress the decrease of the pH of the alkali liquid chemical on the second region R2 and the reduction of the etching rate.

Therefore, the second gas nozzle 15 in the present embodiment feeds, as the second gas, gas that leads to an action to increase the etching rate of the workpiece film with the aforementioned liquid chemical, for example, gas containing choline vapor. It is considered that the etching rate increases because choline vapor dissolves in the aqueous choline solution when the aqueous choline solution flows from the first region R1 to the second region R2.

The semiconductor manufacturing apparatus of the present embodiment further feeds a liquid chemical for etching the workpiece film from the upper face nozzle 19 to the bevel B. The liquid chemical is, for example, an aqueous choline solution and is an example of the second liquid. Also, the lower face nozzle 20 feeds the etching suppressing liquid which suppresses the etching of the bevel B of the wafer 1, similarly to the first embodiment.

In the present embodiment, as shown in FIG. 2, the distance between the outermost portion of the bevel B and the second place in the XY-plane is fixed to a fixed value (for example, 3.0 mm). Meanwhile, the distance between the outermost portion of the bevel B and the first place in the XY-plane is changed within a certain range. For example, as indicated by the arrows in FIG. 2, the upper face nozzle 19 of the present embodiment can change the position of the first place relative to the outermost portion of the bevel B within a range of +140 mm to −2.5 mm in units of 0.1 mm, and ejects the liquid chemical within this range. This makes it possible to adjust a region in which the etching suppressing liquid is fed in the periphery portion of the wafer 1. Also, this enables the liquid chemical ejected from the upper face nozzle 19 to suppress the decrease of the pH of the liquid chemical in the periphery portion of the wafer 1, which can suppress the reduction of the etching rate.

Figure 4A:
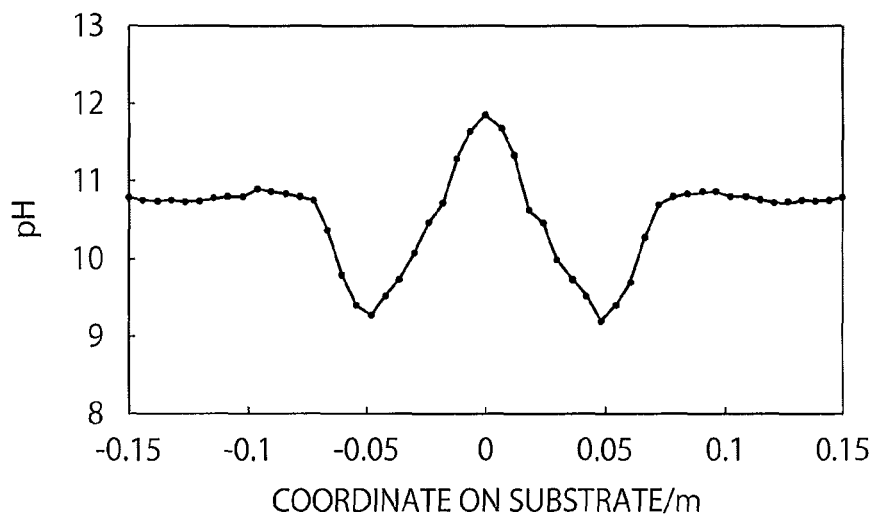
FIGS. 4A to 4C are graphs for explaining details of the third embodiment.
Figure 4B:
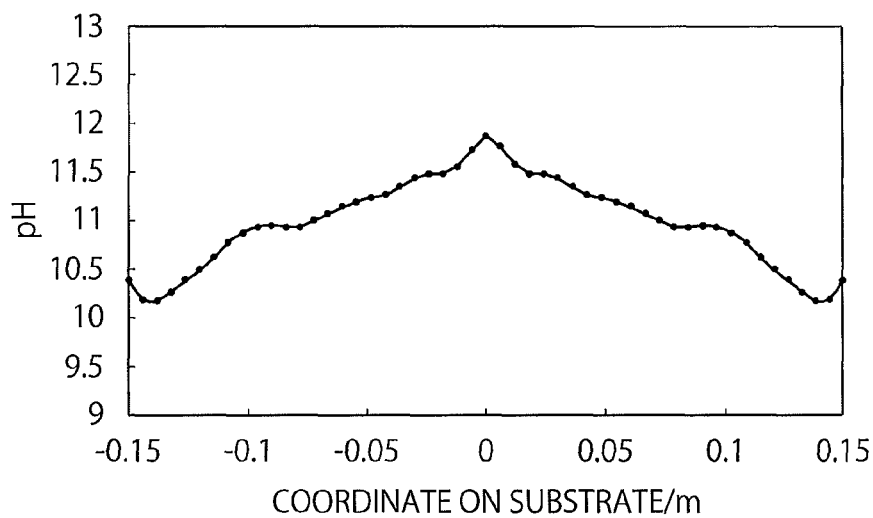
Figure 4C:
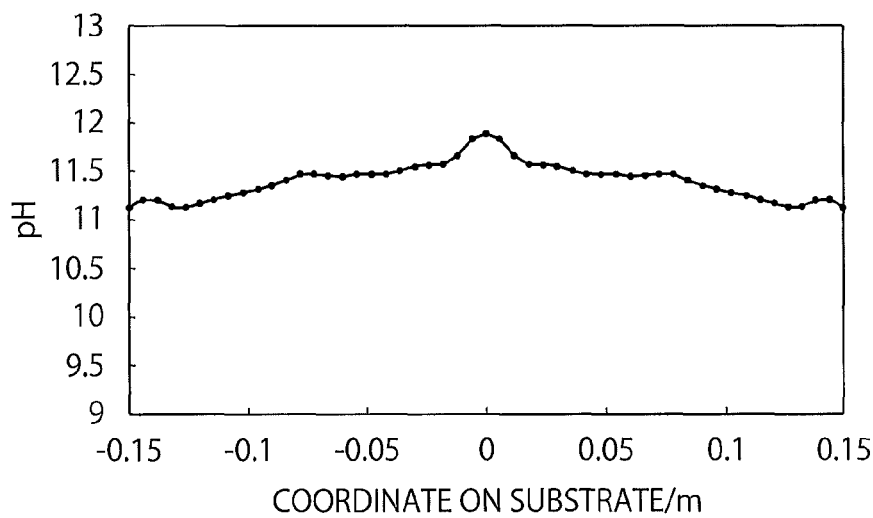

FIGS. 4A to 4C are graphs for explaining details of the third embodiment.

FIGS. 4A, 4B and 4C show, regarding the aqueous choline solution from the liquid chemical nozzle 13, pH distributions of the aqueous choline solution when the number of revolutions of the wafer 1 is 300 rpm, 800 rpm and 1800 rpm, respectively (simulation). In FIGS. 4A to 4C, the horizontal axis denotes a position relative to the outermost portion of the bevel B in a radial direction (coordinate on substrate), and the vertical axis denotes pH of the aqueous choline solution.

Since the etching rate is significantly reduced when the pH of the aqueous choline solution becomes lower than 11, the pH of the aqueous choline solution is desired to be adjusted to 11 or more. According to FIGS. 4A to 4C, it is understood that a range where the pH is lower than 11 exists in the range where the position relative to the outermost portion of the bevel B in the radial direction is +140 mm to 0 mm. Therefore, it is desired to set the first place in the present embodiment in the range of +140 mm to 0 mm.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a supporter configured to support a wafer;
a first member including a first portion that faces a first region on an upper face of the wafer and a second portion that intervenes between the wafer and the first portion, wherein the first portion has an annular shape, and the second portion has a cylindrical shape;
a second member including a third portion that faces a second region on the upper face of the wafer and a fourth portion that intervenes between the wafer and the third portion, wherein the second region is positioned on a side of a periphery portion of the wafer with respect to the first region, the third portion has an annular shape surrounding the first portion, and the fourth portion has a cylindrical shape surrounding the second portion;
a rotator configured to rotate the first member and to rotate the second member independently of the first member;
a first liquid feeder configured to feed a first liquid for processing the wafer to the first region;
a first gas feeder configured to feed a first gas between the wafer and the first portion;
a second gas feeder configured to feed a second gas between the wafer and the second portion; and
a second liquid feeder configured to feed a second liquid to the wafer, wherein the second liquid feeder includes an upper face feeder configured to feed the second liquid to the second region of the upper face of the wafer, and, in addition to the upper face feeder, a lower face feeder configured at a lower face of the wafer to feed the second liquid to the lower face of the wafer, and the upper and lower face feeders feed the second liquid to an edge portion of the wafer, wherein
the first and second portions are disposed to fill a space above the first region with the first gas, and
the second, third and fourth portions are disposed to fill a space above the second region with the second gas.

2. The apparatus of claim 1, wherein
the first liquid feeder feeds the first liquid for etching a film on the wafer,
the first gas feeder feeds the first gas for increasing a rate of the etching,
the second gas feeder feeds the second gas for decreasing or increasing the rate of the etching; and
the second liquid feeder feeds the second liquid for suppressing the etching.

3. The apparatus of claim 1, wherein the first and second gas feeders respectively feed the first and second gases that contain an etchant same as an etchant in the first liquid.

4. The apparatus of claim 3, further comprising:
a first adjuster configured to adjust a concentration of the etchant in the first gas; and
a second adjuster configured to adjust a concentration of the etchant in the second gas.

5. The apparatus of claim 1, wherein
an end of a nozzle of the first liquid feeder is disposed at a position that is closer to the wafer than a position of an end of a nozzle of the first gas feeder,
an end of a nozzle of the upper face feeder in the second liquid feeder is disposed at a position that is closer to the wafer than a position of an end of a nozzle of the second gas feeder,
an end of a nozzle of the lower face feeder in the second liquid feeder is disposed at a position that is closer to a center of the wafer than the position of the end of the nozzle of the upper face feeder in the second liquid feeder, and more distant from the center of the wafer than the position of the end of the nozzle of the first liquid feeder, an end of the second portion is disposed at a position that is closer to the wafer than the position of the end of the nozzle of the first liquid feeder, and an end of the fourth portion is disposed at a position that is closer to the wafer than the position of the end of the nozzle of the upper face feeder in the second liquid feeder.

6. The apparatus of claim 1, wherein an end of a nozzle of the first liquid feeder and an end of a nozzle of the first gas feeder are positioned at a first place that is in a vicinity of a center portion of the wafer, an end of a nozzle of the upper face feeder in the second liquid feeder and an end of a nozzle of the second gas feeder are positioned at a second place that is on a side of the periphery portion of the wafer with respect to the first region, and the apparatus comprises, as a pair of the end of the nozzle of the upper face feeder in the second liquid feeder and the end of the nozzle of the second gas feeder, a plurality of pairs at a plurality of second places that are positioned on a same circle.

* * * * *